US007145356B2

(12) United States Patent
Sang Gi

(10) Patent No.: US 7,145,356 B2
(45) Date of Patent: Dec. 5, 2006

(54) CIRCUITS FOR TRANSISTOR TESTING

(75) Inventor: Lee Sang Gi, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/021,451

(22) Filed: Dec. 23, 2004

(65) Prior Publication Data

US 2005/0156605 A1    Jul. 21, 2005

(30) Foreign Application Priority Data

Dec. 24, 2003   (KR) ...................... 10-2003-0096992

(51) Int. Cl.
  *G01R 31/26* (2006.01)
  *G01R 31/02* (2006.01)
  *H01L 27/01* (2006.01)
(52) U.S. Cl. .................... 324/769; 324/765; 324/158.1; 324/537; 257/48
(58) Field of Classification Search ................ 324/769, 324/158.1, 750–765
See application file for complete search history.

(56) References Cited

U.S. PATENT DOCUMENTS

| 4,309,627 A | * | 1/1982 | Tabata | 327/81 |
| 5,331,599 A | * | 7/1994 | Yero | 365/226 |
| 5,561,373 A | * | 10/1996 | Itoh | 324/158.1 |

* cited by examiner

*Primary Examiner*—Vinh Nguyen
*Assistant Examiner*—Emily Y Chan
(74) *Attorney, Agent, or Firm*—Andrew D. Fortney

(57) ABSTRACT

Disclosed is a circuit for transistor testing, by which electrical stresses of separate conditions can be simultaneously applied to a plurality of transistors, respectively. According to one example, such a circuit may include a plurality of contact pads connectable to a plurality of terminals of a plurality of transistors, a plurality of first resistors connected to a plurality of gates of a plurality of the transistors, respectively by voltage distribution according to a resistance ratio, respectively, and a plurality of second resistors connected between a plurality of gate electrodes and drains of a plurality of the transistors, respectively wherein a plurality of voltages applied to a plurality of the gates of a plurality of the transistors are dropped by a plurality of the second resistors to be applied to a plurality of drains of a plurality of the transistors, respectively.

4 Claims, 2 Drawing Sheets

CIRCUITS FOR TRANSISTOR TESTING

TECHNICAL FIELD

This application claims the benefit of the Korean Application No. P2003-0096992, filed on Dec. 24, 2003, which is hereby incorporated by reference.

The present disclosure relates generally to circuits and, more particularly, to circuits for transistor testing.

BACKGROUND

Generally, a degradation degree of a transistor can be determined by measuring a drain current that results from voltages applied to a gate and drain.

FIG. 1 is an equivalent circuit of a test circuit for measuring a degradation degree of a transistor according to a related art. Referring to FIG. 1, in a test circuit for measuring a degradation degree of a transistor, prescribed voltages, e.g., 2 volts (V) and 4V, are applied to gate and drain electrodes, respectively. After applying an electrical stress to a transistor, a drain current as a device parameter of the transistor is detected to measure a degree of device degradation.

After completion of measuring the device parameter of the transistor for one electrical stress condition, a separate electrical stress condition, e.g., 5V drain voltage and 2.5V gate voltage, is applied to another transistor. A new drain current is then detected using a probe card to measure the degradation degree.

Thus, the degradation degree and lifetime of each transistor are measured by sequentially measuring drain currents of a plurality of transistors by applying the entire electrical stress conditions to be measured, respectively.

However, in case of measuring lifetimes of transistors by the test circuit in FIG. 1, the degradation degree should be measured in a manner of applying one electrical stress of one condition to one transistor each. Hence, it takes a considerable time (at least 3 hours) to find a time for seeking 10% drain saturation current (IDSAT) for each stress condition.

Moreover, because the device degradation of transistor should be measured under various conditions to measure an accurate lifetime of transistor, the time needed increases with the number of devices to be tested.

DETAILED DESCRIPTION

Figure 1:
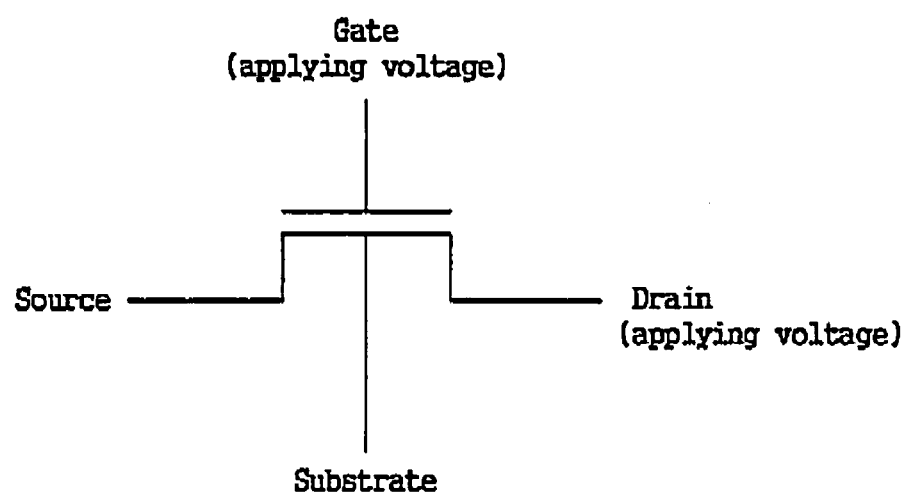
FIG. 1 is a diagram of an equivalent circuit of a known test circuit for measuring a degradation degree of a transistor.
Figure 2:
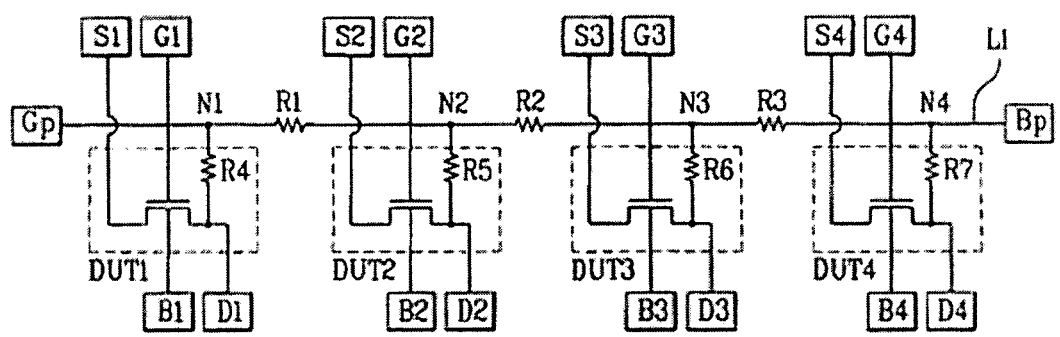
FIG. 2 a diagram of an equivalent circuit of an example disclosed test circuit capable of measuring degradation degrees of a plurality of transistors simultaneously.

Referring to FIG. 2, a disclosed circuit 100 for transistor test includes gate pads G1 to G4, source pads S1 to S4, drain pads D1 to D4, and substrate pads B1 to B4 connected to gate electrodes, source electrodes, drain electrodes, and substrate electrodes of four transistors (devices under test) DUT1 to DUT4, respectively. A gate pulse pad Gp and gate bulk pad Bp for are provided for applying specific voltages to the gate and drain electrodes of the four transistors, respectively. A connecting line L1 connecting the gate pulse and gate bulk pads Gp and Bp to each other is provided with resistors R1 to R3 between the gates of the respective transistors, and resistors R4 to R7 inserted between the connecting line L1 and the drain electrodes, respectively.

Specifically, the gate pulse pad Gp and the gate bulk pad Bp are connected by the connecting line L1. The connecting line L1 includes nodes N1 to N4 connected to the gate electrodes of the transistors, respectively, the resistor R1 connected between the nodes N1 and N2, the resistor R2 connected between the nodes N2 and N3, and the resistor R3 connected between the nodes N3 and N4. Further, the connecting line L1 is connected to the drain of the transistor DUT1 via the resistor R4, the drain of the transistor DUT2 via the resistor R5, the drain of the transistor DUT3 via the resistor R6, and the drain of the transistor DUT4 via the resistor R7.

Hence, by applying a specific voltage difference between the pads Gp and Bp, prescribed voltages are applied to the gate and drain electrodes of the transistors DUT1 to DUT4, respectively.

An operation of the example circuit of FIG. 2 is explained as follows.

First of all, prescribed voltage differences occur between the nodes N1 to N4 by the resistors R1 to R3, respectively, whereby different voltages are applied to the gate electrodes of the transistors DUT1 to DUT4, respectively. For instance, if 4.0V is applied to the pad Gp to generate 0.2V differences between the nodes N1 to N4, respectively, 4.0V is applied to the gate electrode of the transistor DUT1, 3.8V is applied to the gate electrode of the transistor DUT2, 3.6V is applied to the gate electrode of the transistor DUT3, and 3.4V is applied to the gate electrode of the transistor DUT4.

Prescribed voltage differences occur between the nodes N1 to N4 and the drain electrodes of the transistors DUT1 to DUT4 by the resistors R4 to R7, respectively, whereby different voltages are applied to the drain electrodes of the transistors DUT1 to DUT4, respectively. For instance, if 4.0V is applied to the pad Gp to generate 2V differences between the nodes and the drain electrodes of the transistors, a voltage of the node N1 is 4.0V and a voltage of the drain electrode of the transistor DUT1 is 2.0V by the resistor R4. A voltage of 1.8V is applied to the drain electrode of the transistor DUT2, 1.6V is applied to the drain electrode of the transistor DUT3, and 1.4V is applied to the drain electrode of the transistor DUT4. In doing so, the substrate pads B1 to B4 and the source pads S1 to S4 are grounded.

Thus, by applying different stresses to the gate and drain electrodes of the transistors, respectively, drain currents as a device parameter may be measured. Namely, parameters indicating device characteristics such as saturation current IDSAT, threshold voltage Vth and the like are measured for each of the transistors DUT1 to DUT4.

Specifically, the degradation degree of the transistor can be measured by detecting the saturation drain current. The saturation drain current needs to be measured at an operational voltage Vop. In its measurement condition, a drain voltage Vd is equal to the operational voltage Vop, a gate voltage is equal to the operational voltage Vop, a source voltage 0V, and a substrate bulk voltage is 0V. For instance, while each of the source and substrate pads S1 and B1 of the transistor DUT1 has 0V, the drain current is measured after applying the operational voltage to the gate and drain pads G1 and D1.

In the same manner, the drain current of each the transistors DUT2 to DUT4 is measured as a time function. Subsequently, the measured value is compared to an initial value. A reduction rate is found to measure a lifetime of the device.

The degree of degradation is analyzed into a percentage (%) that represents a variation according to a time for initial values of the drain current and threshold voltage of the corresponding transistor.

The lifetime is measured in a manner of setting a criterion to a value (time) of 10% degradation for each stress condition. The saturation current is a function of the threshold voltage. The threshold voltage means a voltage at which a strong inversion takes place. The value of the threshold voltage can be measured in a drain current to gate voltage curve.

As described above, the degradation degrees of a plurality of transistors can be simultaneously measured using one test circuit, whereby the degradation degree and lifetime of the transistor can be quickly and efficiently estimated.

Accordingly, as disclosed herein, if the stress corresponding to one condition (maximum gate and drain voltages) is applied, the separate stress conditions are applied to a plurality of transistors, respectively to enable the simultaneous measurements for the degradation degrees of the transistors for the entire conditions. Therefore, the disclosed system simultaneously measures various devices with the time taken for measuring one transistor in the related art method to reduce time loss, thereby raising work efficiency.

The resistors are connected to generate specific voltage drops of the gate or drain electrodes of the transistors, respectively, whereby the various test circuits may be implemented.

As disclosed herein, a transistor testing circuit enables electrical stresses of separate conditions to be applied simultaneously to a plurality of transistors, respectively.

According to one example, a transistor test circuit may include a plurality of contact pads connectable to a plurality of terminals of a plurality of transistors, a plurality of first resistors connected to a plurality of gates of a plurality of the transistors, respectively by voltage distribution according to a resistance ratio, respectively, and a plurality of second resistors connected between a plurality of gate electrodes and drains of a plurality of the transistors, respectively wherein a plurality of voltages applied to a plurality of the gates of a plurality of the transistors are dropped by a plurality of the second resistors to be applied to a plurality of drains of a plurality of the transistors, respectively.

As disclosed herein, a plurality of the contact pads include a gate pulse pad and a gate bulk pad for applying a maximum voltage to be applied to the gate of each of the transistors. In one example, voltage differences between the voltages applied to the gates of a plurality of the transistors are equal to each other. Additionally, voltage differences between the voltages applied to the drains of a plurality of the transistors may be equal to each other.

In another example, an integrated circuit may include a plurality of transistors and a test circuit for measuring degradation degrees of a plurality of the transistors. Such a test circuit may include a plurality of contact pads connectable to a plurality of terminals of a plurality of the transistors, a plurality of first resistors connected to a plurality of gates of a plurality of the transistors, respectively by voltage distribution according to a resistance ratio, respectively, and a plurality of second resistors connected between a plurality of gate electrodes and drains of a plurality of the transistors, respectively wherein a plurality of voltages applied to a plurality of the gates of a plurality of the transistors are dropped by a plurality of the second resistors to be applied to a plurality of drains of a plurality of the transistors, respectively. A plurality of the contact pads may include a gate pulse pad and a gate bulk pad for applying a maximum voltage to be applied to the gate of each of the transistors. In such an arrangement, voltage differences between the voltages applied to the gates of a plurality of the transistors are equal to each other. Additionally, voltage differences between the voltages applied to the drains of a plurality of the transistors may be equal to each other.

This application claims the benefit of the Korean Application No. P2003-0096992 filed on Dec. 24, 2003, which is hereby incorporated by reference.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A circuit for testing a plurality of transistors including a first transistor and a second transistor, the circuit comprising:
   a first resistor connected between a gate and a, drain of the first transistor, the first resistor dropping a first voltage applied to the gate of the first transistor to a second voltage applied to the drain of the first transistor,
   a second resistor connected between a gate and a drain oldie second transistor, the second resistor dropping a third voltage applied to the gate of the second transistor to a fourth voltage applied to the drain of the second transistor, and
   a third resistor connected between the gate of the first transistor and the gate of the second transistor, the first resistor dropping the first voltage to the third voltage.

2. A circuit as defined by claimed 1, wherein the first resistor establishes a first voltage drop, the second resistor establishes a second voltage drop, and the first voltage drop is equal to the second voltage drop.

3. An integrated circuit including a test circuit for resting a plurality of transistors including a first transistor and a second transistor, the test circuit comprising:
   a first resistor connected between a gate and a drain of the first transistor, the first resistor dropping the first voltage applied to the gate oldie first transistor to a second voltage applied to the drain of the first transistor;
   a second resistor connected between a gate and a drain of the second transistor, the second resistor dropping the third voltage applied to the gate of the second transistor to a fourth voltage applied to the drain of the second transistor; and
   a third resistor connected between the gate of the first transistor and the gate of the second transistor, the first resistor dropping the first voltage to the third voltage.

4. A circuit as defined by claimed 3, wherein the first resistor establishes a first voltage drop, the second resistor establishes a second voltage drop, and the first voltage drop is equal to the second voltage drop.

* * * * *